(12) United States Patent
Myles

(10) Patent No.: US 9,065,392 B2
(45) Date of Patent: Jun. 23, 2015

(54) DIVIDE BY 2 AND 3 CHARGE PUMP METHODS

(71) Applicant: Dialog Semiconductor GmbH, Kirchheim/Teck-Nabern (DE)

(72) Inventor: Andrew Myles, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 13/782,331

(22) Filed: Mar. 1, 2013

(65) Prior Publication Data

US 2014/0240034 A1   Aug. 28, 2014

(30) Foreign Application Priority Data

Feb. 28, 2013  (EP) ..................................... 13368003

(51) Int. Cl.
G05F 1/10       (2006.01)
G05F 3/02       (2006.01)
H03F 3/21       (2006.01)
H02M 3/07       (2006.01)

(52) U.S. Cl.
CPC .. H03F 3/21 (2013.01); H02M 3/07 (2013.01)

(58) Field of Classification Search
CPC . H02M 3/073; H02M 3/07; H02M 2003/077; G11C 5/145; G05F 3/205
USPC ................. 327/536; 363/59–60; 307/109–110
See application file for complete search history.

(56) References Cited

U.S. PATENT DOCUMENTS

| | | | | |
|---|---|---|---|---|
| 5,461,557 A | * | 10/1995 | Tamagawa | ....................... 363/60 |
| 5,532,916 A | * | 7/1996 | Tamagawa | ....................... 363/62 |
| 5,654,677 A | | 8/1997 | Dent | |
| 6,563,235 B1 | * | 5/2003 | McIntyre et al. | ............. 307/109 |
| 7,382,176 B2 | | 6/2008 | Ayres et al. | |
| 7,626,445 B2 | | 12/2009 | Lesso et al. | |
| 7,990,742 B2 | * | 8/2011 | Lesso | .............................. 363/62 |
| 8,044,706 B2 | | 10/2011 | Saman et al. | |
| 8,044,707 B2 | | 10/2011 | Saman et al. | |
| 2008/0116979 A1 | | 5/2008 | Lesso et al. | |

(Continued)

FOREIGN PATENT DOCUMENTS

| | | | | |
|---|---|---|---|---|
| EP | 2 402 008 | | 1/2012 | |
| EP | 2469694 A1 | * | 6/2012 | .................... 327/536 |
| WO | WO 2009/138806 | | 11/2009 | |

OTHER PUBLICATIONS

"Design Techniques for Fully Integrated Switched-Capacitor DC-DC Converters," by Hanh-Phuc Le, et al., IEEE Journal of Solid-State Circuits, vol. 46, No. 9, Sep. 2011, pp. 2120-2131.

(Continued)

*Primary Examiner* — Quan Tra
(74) *Attorney, Agent, or Firm* — Saile Ackerman LLC; Stephen B. Ackerman

(57) ABSTRACT

The present disclosure relates to methods and circuits to achieve ground centered charge-pumps generating output voltages of +/−VDD/2 or +/−VDD/3 while achieving high efficiency of power conversion and minimized output impedances. Key points of the disclosure are minimizing number of switching states, reducing the time required for transition through all switching states, maintain constant flying capacitor voltages in all switching states, and, ideally, configuring the size of the flying capacitors large enough to provide the required load charge of each switching state without voltage change of the flying capacitors.

26 Claims, 7 Drawing Sheets

2 FLYING CAPACITOR CHARGE PUMP CAPABLE OF GENERATING OUTPUT VOLTAGES +/- VDD, +/-VDD/2, +/-VDD/3, +/-VDD/4, +/-VDD/5, +/-VDD/6 WITH HIGH EFFICIENCY (NO CHARGE-UP LOSSES)

(56) References Cited

U.S. PATENT DOCUMENTS

| | | |
|---|---|---|
| 2008/0144861 A1 | 6/2008 | Melanson et al. |
| 2008/0150620 A1 | 6/2008 | Lesso |
| 2011/0204724 A1 | 8/2011 | Verma et al. |
| 2012/0163632 A1* | 6/2012 | Lesso et al. ............ 381/107 |
| 2012/0242413 A1 | 9/2012 | Lesso |

OTHER PUBLICATIONS

"On Lossless Switched-Capacitor Power Converters," by C. K. Tse et al., IEEE Transactions on Power Electronics, vol. 10, No. 3, May 1995, pp. 286-291.

"Efficiency Improvement in Charge Pump Circuits," by Chi-Chang Wang et al., IEEE Journal of Solid-State Circuits, vol. 32, No. 6, Jun. 1997, pp. 852-860.

Analog Design Essentials, by Willy M. C. Sansen, Published by Springer, Dordrecht, The Netherlands, Copyright 2006, pp. 485-487.

"Switched Capacitors Converters," by Sam Ben-Yaakov, APEC09, Feb. 2009, Power Electronics Labratory, Dept. of Electrical and Computer.

Engineering, Ben-Gurion University of the Negev, Beer-Sheva, Israel, Copyright S. Ben-Yaakov 2009, 65 pgs.

European Search Report 13368003.3-1809 Mailed: Jul. 31, 2013, Dialog Semiconductor GmbH.

"Switched Capacitors Converters," by Sam Ben-Yaakov, APEC09, Full set of slides: http://www.ee.bgu.ac.il/~pel/seminars/APEC09.pdf, Feb. 2009, 65 pgs.

"Performance Limits of Switched-Capacitor DC-DC Converters," by Marek S. Makowski et al, 1995 IEEE, Jun. 18, 1995, 0-7803-2730-6/95, pp. 1215-1221.

"Adiabatic Charging of Capacitors by Switched Capacitor Converters with Multiple Target Voltages," by Dmitry Chernichenko et al., 2012 IEEE 27th Convention of Electrical and Electronics Engineers in Israel, Nov. 14, 2012, pp. 1-4.

"Design of High Efficiency Step-Down Switched Capacitor DC/DC Converter," by Mengzhe MA, a Thesis submitted to Oregon State University in partial fulfillment of the requirements for the degree of Master of Science, Presented May 21, 2003, 65 pgs.

ISSCC 2014 Tutorial, "T9: Charge Pump and Capacitive DC-DC Converter Design," prepared by Tim Piessens, and presented by Anton Bakker, Feb. 9, 2014.

Analog Design Essentials, by Willy M.C. Sansen, Published by Springer, 2006, The Netherlands, pp. 485-487.

ISSCC 2013 / Session 21 / Power Converters / 21.5, "A Fully Integrated Succissive-Approximation Switched-Capacitor DC-DC Converter with 31mV Output Voltage Resolution," by Suyoung Bang et al., Feb. 20, 2013, pp. 370-372.

"A Family of Multimodes Charge Pump based DC-DC Converter With High Efficiency over Wide Input and Output Range," by Rong Guo et al., IEEE Transactions on Power Electronics, vol. 27, No. 11, Nov. 2012, pp. 4788-4798.

A Sizing Methodology for On-Chip Switched-Capacitor DC/DC Converters, by Julien De Vos et al., IEEE Transactions on Circuits and Systems—I: Regular Papers, vol. 61, No. 5, May 2014, pp. 1597-1606.

"Voltage Scalable Switched Capacitor DC-DC Converter for Ultra-Low-Power On-Chip," by Yogesh K. Ramadass et al., 2007 IEEE, Jun. 17-21, 2007, pp. 2353-2359, 1-4244-0655-2/07.

"A General Method for Deriving Output Resistance of Serial Fixed Type Switched-Capacitor Po wer Suppiles," by Ichirou Oota et al., ISCAS 2000—IEEE International Symposium on Circuits and Systems, May 28-31, 2000, Geneva, Switzerland, pp. 503-506.

"Analysis and Optimization of Switched-Capacitor, DC-DC Converters," by Michael D. Seeman et al., IEEE Transactions on Power Electronics, vol. 23, No. 2, Mar. 2008, pp. 841-851.

"On Lossless Switched-Capacitor Power Converters," by C.K. Tse et al., IEEE Transactions on Power Electronics, vol. 10, No. 3, May 1995, pp. 286-291.

"Design Techniques for Fully Integrated Switched-Capacitor DC-DC Converters," by Hanh-Phuc Le et al., IEEE Journal of Solid-State Circuits, vol. 46, No. 9, Sep. 2011, pp. 2120-2131.

\* cited by examiner

POS = VDD/2, NEG = -VDD/2
FLYING CAPACITORS ONLY, RESERVOIR CAPACITORS NOT SHOWN

SINGLE FLYING CAPACITOR +/- VDD/2 CHARGE PUMP

DIVIDE BY 2 AND 3 CHARGE PUMP METHODS

TECHNICAL FIELD

The present document relates to charge pumps In particular, the present document relates to efficient switched capacitors charge pumps that generate outputs+/−VDD/2 and/or +/−VDD/3 from an input voltage VDD.

BACKGROUND

There are many different applications for charge pump power converters such as e.g. for efficiently generating the supply rails for ground-centered class-G headphone drivers; these are a key feature customers expect in modern audio codecs. Magnetics-based power converters such as Buck converters are usually considered too costly and complex (inductor size and PCB space, on-chip flyback currents and voltage spikes, sensing and feedback control etc.) for this application.

There is still a need for improvements with present charge pumps such as:

A key requirement for any charge pump power converter is achieving low output impedance. This gives better load regulation, i.e. less output voltage droop and associated energy losses when load current is drawn from a given charge pump output.

In a specific case of a charge pump used to generate output stage supply voltages for a class-G amplifier, minimizing droop under load increases the overall amplifier efficiency by enabling closer envelope tracking (increasing efficiency is the main reason for using a class-G amplifier over a class-A or AB amplifier with fixed supply voltages).

A further desirable characteristic for a ground-centered charge pump when used to supply class-G amplifiers is equal output impedance on both outputs to give good output voltage symmetry under load, as the lowest of the positive or negative output voltage defines the peak voltage a sine wave can assume when being processed by the amplifier, and hence power deliverable to the amplifier load. FIG. 1 illustrates how the maximum signal 1 amplitude is set by the output with the most droop when loaded (POS is the positive charge pump output and NEG is the negative output).

A special challenge for designers of charge pumps is:
1. Achieving high power conversion efficiency and, related,
2. Minimizing output impedance (to achieve good load regulation).

SUMMARY

A principal object of the present disclosure is to achieve high power conversion efficiency of a ground-centered charge pump.

Another principal object of the present disclosure is to achieve low output impedance for a ground-centered charge pump power converter.

A further object of the disclosure is to achieve equal, or nearly equal, output impedance on both outputs of the charge pump.

A further object of the disclosure is to generate by a charge pump output stage supply voltages for a class-G amplifier while minimizing droop under load.

A further object of the disclosure is to generate +/−VDD/2 and/or +/−VDD/3 output voltages.

In accordance with the objects of this disclosure a method achieving high power conversion efficiency of ground-centered charge pumps and minimizing output impedance on both outputs to achieve good load regulation, wherein both positive and negative output voltages have an equally divided output voltage compared to an input voltage VDD of the charge pump has been disclosed. The method disclosed firstly comprises the steps of: providing a ground-centered charge pump, a switching network, a port for positive output voltage (VPOS), a port for negative output voltage (VNEG), and at least one flying capacitor, reducing number of switching states of the switching network required, and reducing the time required for transition through all switching states. Furthermore the method discloses the steps of: maintaining constant flying capacitor voltages in all switching states.

In accordance with the objects of this disclosure a ground-centered charge pump providing voltages of +/−VDD/3 at its respective positive and negative output ports, achieving high power conversion efficiency and minimizing output impedance has been disclosed. The charge-pump comprises: 2 flying capacitors which are connected by a switching network in two switching states in order to generate the voltage of +VDD/3 at a positive output port and the voltage of −VDD/3 at its negative output port, and said switching network configured to operate with two switching states and to maintain constant flying capacitor voltages in both states.

In accordance with the objects of this disclosure a ground-centered charge pump providing voltages of +/−VDD/2 at its respective positive and negative output ports, achieving high power conversion efficiency and minimizing output impedance has been disclosed. The charge pump comprises 2 flying capacitors which are connected by a switching network in two switching states in order to generate the voltage of +VDD/2 at a positive output port and the voltage of −VDD/2 at its negative output port, and said switching network configured to operate with two switching states and to maintain constant flying capacitor voltages in both states.

BRIEF DESCRIPTION OF THE FIGURES

The invention is explained below in an exemplary manner with reference to the accompanying drawings, wherein.

DETAILED DESCRIPTION

Methods and circuits to enhance the overall efficiency of charge pumps; especially for generating the supply rails for ground-centered class-G amplifiers such as headphone drivers are disclosed.

Figure 1:
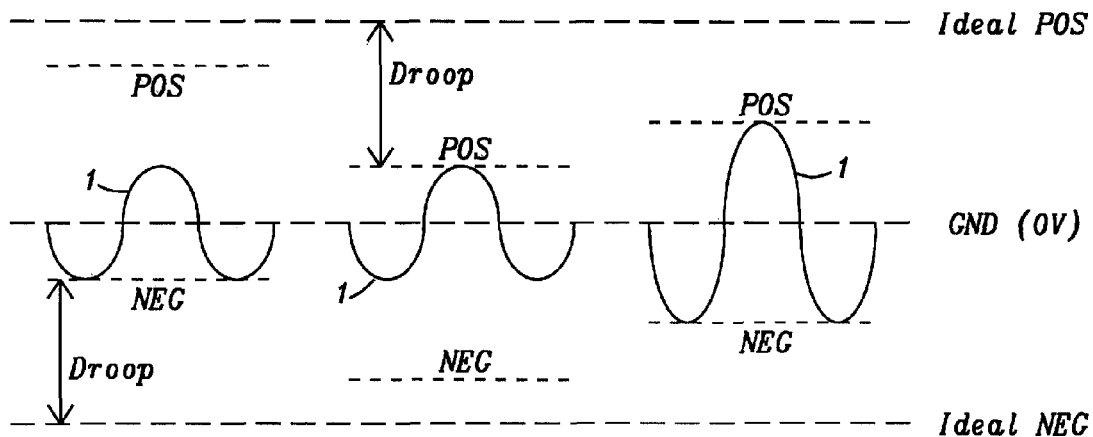
FIG. 1 illustrates of how the lowest supply rail for a class-G amplifier sets the maximum signal amplitude.

FIG. 1 illustrates how the lowest supply rail sets the maximum signal amplitude of a class-G amplifier. FIG. 1 shows three cases wherein in the case to the left VPOS>−VNEG caused by high output impedance of the NEG output, the case in the middle of FIG. 1 shows VPOS<VNEG caused by high output impedance of the POS output, and the case to the right shows VPOS=−VNEG where both outputs have identical impedance. In all three cases the difference between VPOS and VNEG is the same.

It has to be noted that the case VPOS=−VNEG has the highest amplitude. This leads to the conclusion that for charge pump generating outputs of +/−VDD/n (n=2, 3, . . . ) for supplying a class-G amplifier, it is important that both the POS and NEG outputs have low impedance.

Figure 2:
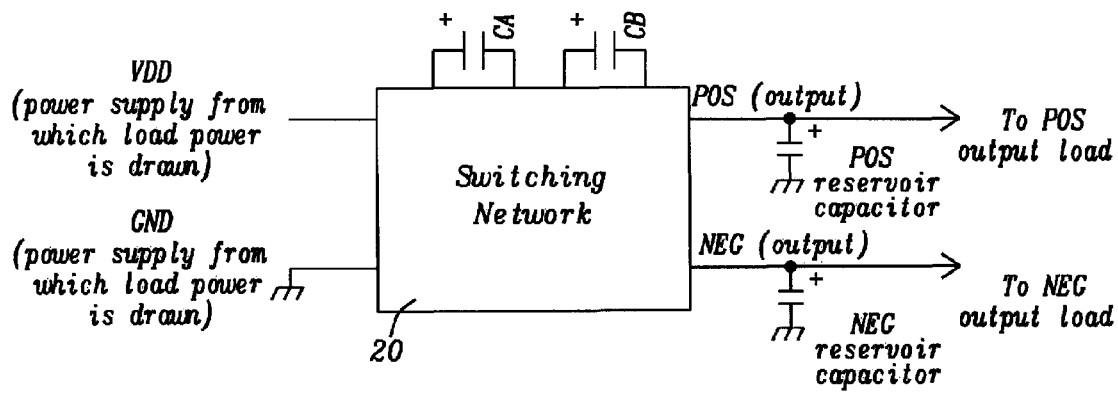
FIG. 2 shows a general view of a switched-capacitor charge pump comprising two flying capacitors and a port-to-port switching network comprising switches which can connect any two of its input ports together.

FIG. 2 shows a general view of a switched-capacitor charge pump comprising two flying capacitors, CA and CB, and a port-to-port switching network 20 comprising switches which can connect any two of its input ports together (ideally the switches have zero Ohm resistance). The switching network is also driven by a timing signal (e.g. a clock) and can implement a new port-to-port switches configuration ("switching state") on each arriving timing pulse. The specific sequence of switching states implemented controls the detailed charge pump operation such as defining its output voltages, efficiency, and load regulation by the specific sequence of switch connections made by the switching network. Charge reservoir capacitors on outputs POS and NEG maintain the voltages at these nodes whenever no flying capacitor is connected to them to provide current to their output loads.

For the charge pumps considered here, POS and NEG are symmetrically positioned around system ground GND, i.e. (voltage NEG)=−(voltage POS), but asymmetric charge pumps are also possible.

The charge pumps described here use two flying capacitors, but any number of flying capacitors can be used depending on the number of output voltage modes required and how they are implemented.

A charge pump is an efficient power converter if the majority (ideally, all) of the energy taken from source VDD-GND is delivered to the loads connected to POS and NEG with little (ideally, no) energy lost inside the charge pump.

One requirement that must be satisfied to achieve high efficiency is that the voltages across flying capacitors CA and CB must not change when transitioning from one configuration of the switching network to another while operating in a given output voltage mode. If a charge pump generates a particular output voltage by connecting capacitors in a way that causes any of them to charge or discharge even when there are no output loads then energy is lost. For example, a charge pump using charge sharing to generate a voltage VDD/2 by connecting in parallel 2 equal flying capacitors, one initially discharged and one initially charged to VDD, draws power from the VDD energy source even when the charge pump output is unloaded.

The physical basis for this loss is that if a capacitor C with voltage V1 across it is charged to a different voltage V2 via a (resistive) switch, then a thermal energy loss $$\text{Energy loss} = \tfrac{1}{2} \cdot C \cdot (\Delta V)^2$$

results, where $\Delta V = |V2 - V1|$. This arises from the fact that moving a charge Q against a potential difference V requires work (work=Q·V) to be done, and the resulting energy lost to the environment as heat is known as "charge-up loss" in charge pump power converters where $\Delta V$ is non-zero.

A side-effect of avoiding charge-up loss is that efficient charge pump power converters can only generate a fixed number of output voltages, unlike magnetic converters such as Buck converters which can generate a continuous range of output voltages by duty cycle control. One challenge in charge pump design is to generate efficiently as many voltage division ratios as possible for a given number of flying capacitors.

Charge-up loss can in theory be avoided by:
Charging or discharging a capacitor via an ideal inductor (as happens in a lossless, ideal LC oscillation)
Using an ideal current source to charge C (c.f. some adiabatic logic styles)
Using zero-volt switching (ZVS) to charge C However, adding low-loss power inductors considerably complicates the charge pump design and cost, real current sources are far from ideal and involve internal voltage drops with attendant power dissipation, and ZVS is better suited to charge pumps with AC. input. Thus neither option is attractive in practice for DC-DC power converting charge pumps and so efficient DC voltage converting charge pumps must avoid charge-up loss by maintaining constant flying capacitor voltages throughout their switching sequences, and are thus limited to generating a fixed set of possible output voltages.

Figure 3:
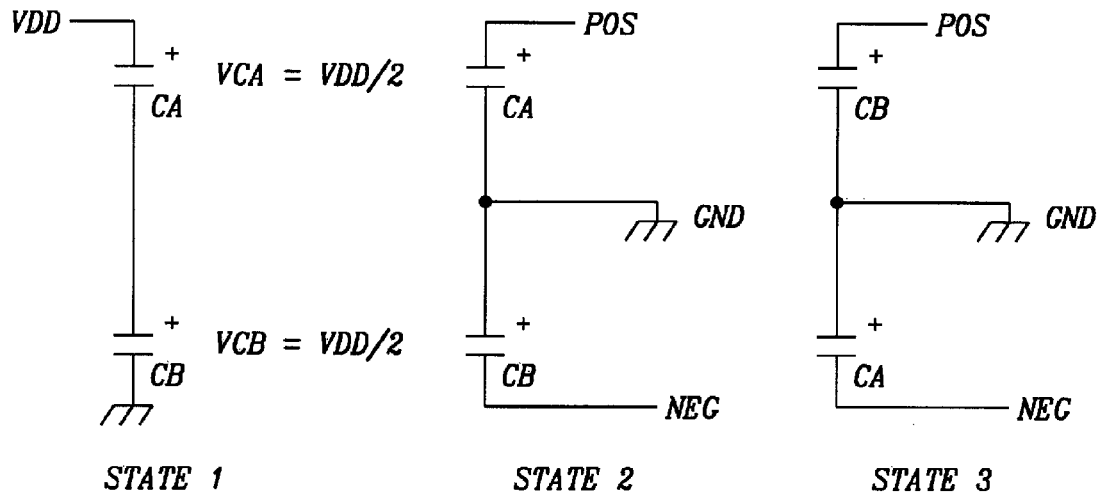
FIG. 3 shows a charge pump switching sequence for generating output voltages POS=VDD/2 and NEG=−VDD/2.

FIG. 3 shows a charge pump switching sequence for generating output voltages POS=VDD/2 and NEG=−VDD/2. It should be noted that the individual switches are not shown to avoid cluttering the figures, however the capacitor positive terminals and switch network port names are shown and it is possible to infer unambiguously which port-to-port connecting switches are closed in each state. Note too that not all port-port connection possibilities are required and a real implementation would include only those switches required.

The order of any pure series capacitor connections, such as in shown in state 1, is obviously arbitrary, and the positions of CA and CB can be exchanged without changing the charge pump (output voltages, efficiency, output impedance etc.).

Charge-up loss is avoided by maintaining constant flying capacitor voltages VCA=VDD/2 and VCB=VDD/2 in all states. There will be some ripple on VCA and VCB when the charge pump is loaded, as the flying capacitors alternately charge from VDD and discharge into the NEG load, but this can be minimized by making CA and CB large enough to provide the required load charge $\Delta Q$ in each state ($\Delta Q = IL \times T$ where IL is the load current and T is the state duration) without much change in their voltages ($\Delta VCA = \Delta QA/CA$, $\Delta VCB = \Delta QB/CB$).

Typically this charge pump will cycle though its states in repeating sequence S1, S2, S3, . . . but different sequences are permitted provided that all states S1, S2 and S3 appear in them, e.g. S1, S3, S2, . . . or S1, S2, S1, S3, . . . . Different sequences can give different output impedances at POS and NEG and hence affect load regulation and associated losses.

It is also possible to modify the sequence on-the-fly if the loads on POS and NEG change.

Figure 4:
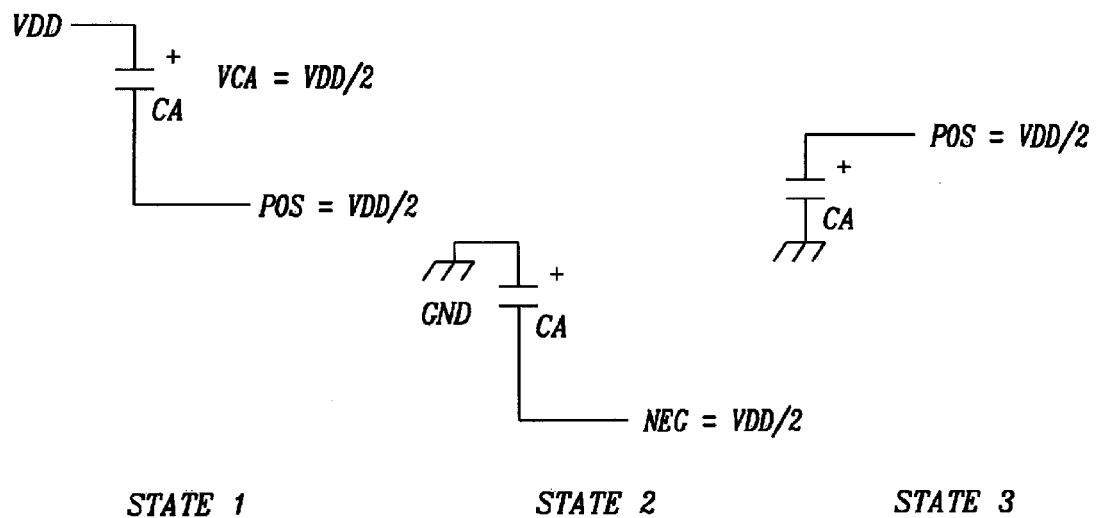
FIG. 4 shows an alternative charge pump switching sequence for generating output voltages POS=VDD/2 and NEG=−VDD/2 using a single flying capacitor.

FIG. 4 shows an alternative charge pump switching sequence for generating output voltages POS=VDD/2 and NEG=−VDD/2 using a single flying capacitor Using a single capacitor enables savings in the number of external capacitors and device pins required by integrated implementations, but this charge pump cannot generate efficiently output voltages less than +/−VDD/2. Charge-up loss is avoided by maintaining VCA=VDD/2 across all states.

Typically the charge pump shown in FIG. 4 will cycle though its states in repeating sequence S1, S2, S3, . . . but different sequences are permitted provided that all states S1, S2 and S3 appear in them, e.g. S1, S3, S2, . . . or S1, S2, S1, S3, . . . . Different sequences can give different output impedances at POS and NEG and hence affect load regulation and associated losses. It is also possible to modify the sequence on-the-fly if the loads on POS and NEG change.

Figure 5:
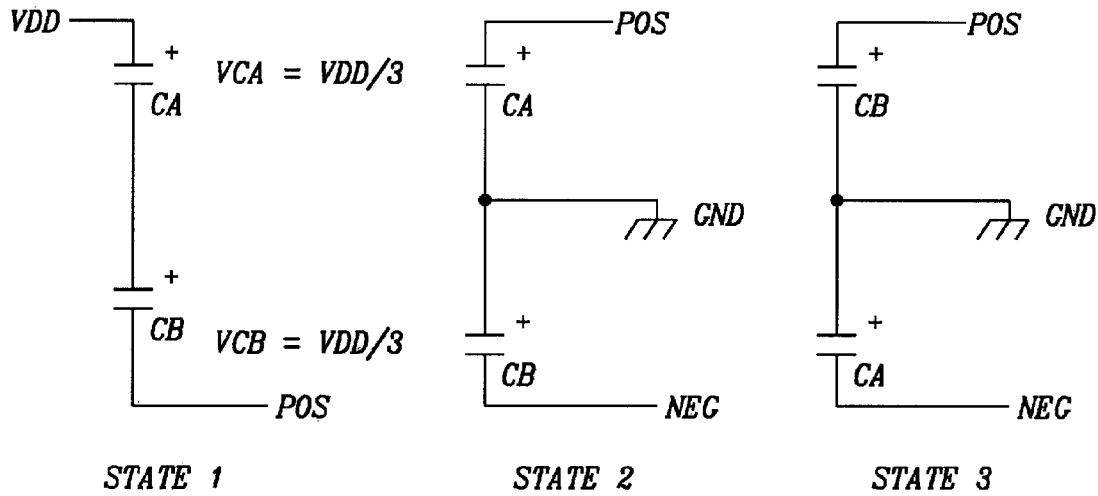
FIG. 5 shows a charge pump switching sequence for generating output voltages POS=VDD/3 and NEG=−VDD/3.

FIG. 5 shows a charge pump switching sequence for generating output voltages POS=VDD/3 and NEG=−VDD/3. Typically this charge pump will cycle though its states in repeating sequence S1, S2, S3, . . . but different sequences are permitted provided that all states S1, S2 and S3 appear in them, e.g. S1, S3, S2, . . . or S1, S2, S1, S3, . . . .

The order of any pure series capacitor connections, such as in shown in state 1, is obviously arbitrary, and the positions of CA and CB can be exchanged without changing the charge pump (output voltages, efficiency, output impedance etc.). Charge-up loss is avoided here by maintaining constant flying capacitor voltages VCA=VDD/3 and VCB=VDD/3 in all states.

In regard of further improved VDD/3 and VDD/2 modes it has to be detected that charge pump output impedance determines the load regulation when converting power, that is, how much the output voltages droop below their ideal values when load current is drawn from the charge pump outputs. Ideally the output impedance will be as low as possible so that the output voltages do not deviate much from their desired ideal values under load and to also minimize power lost as load current flow through any resistive component of the output impedance. Output impedance is a (often complicated) function of:

1. The switch resistances (real switches will have a resistance when closed);
2. The sizes of the flying capacitors; and
3. The sequence used to generate the output voltages.

Concerning point 1 above, avoiding long chains of series connected capacitors helps to avoid connecting many resistive switches in series and hence will generally give lower output impedances. Similarly, using parallel capacitor connections will generally give lower output impedances. Concerning points 2 and 3, a single switched capacitor has an equivalent resistance typically of the form $$Requiv=1/(C \times f),$$

wherein C is the capacitance and f is the frequency through which it is being switched between states. Requiv can be reduced by increasing the capacitor size and/or the frequency of cycling through states. Ideally the effective frequency is increased by using a shorter state sequence so that states recur more rapidly rather than increasing the frequency of the timing clock used to drive the state transitions, as increasing the clock frequency also increases energy losses associated with driving parasitic capacitances.

Figure 6:
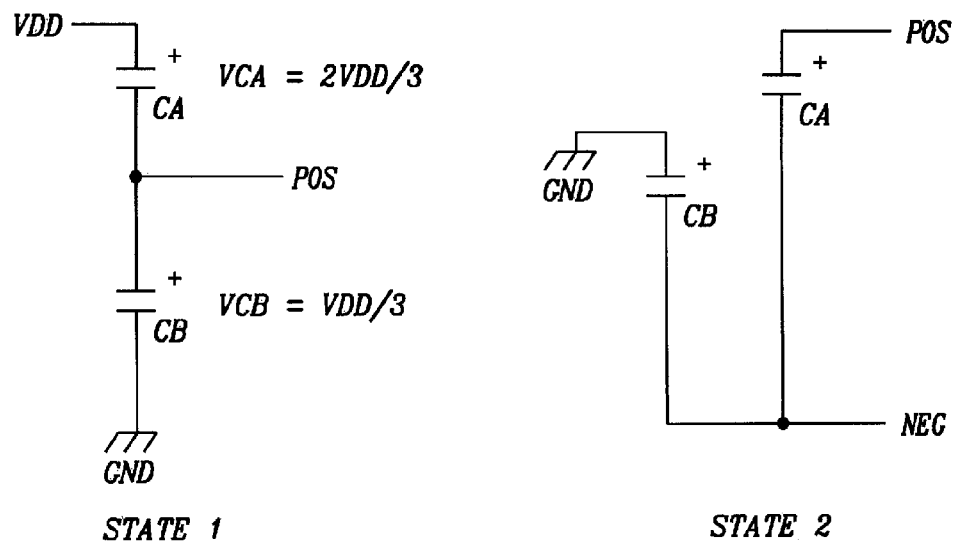
FIG. 6 shows an improved +/−VDD/3 mode charge pump that can reduce output impedances by requiring only 2 states and hence allowing the charge pump to transition through all states in a shorter time.

FIG. 6 shows an improved +/−VDD/3 mode charge pump that can reduce output impedances by requiring only 2 states and hence allowing the charge pump to transition through all states in a shorter time (for a given system clock frequency driving the state transitions). As above, the state order can be rearranged (e.g. from S1, S2, . . . to S1, S2, S2, . . . or S1, S1, S2, . . . ) provided that all states appear in the state sequence. Additionally, parallel flying capacitor connection is used as seen looking into the POS and NEG outputs in states 1 and 2 respectively. Charge-up loss is avoided by maintaining VCA=2×VDD/3 and VCB=VDD/3 in all states.

Figure 7:
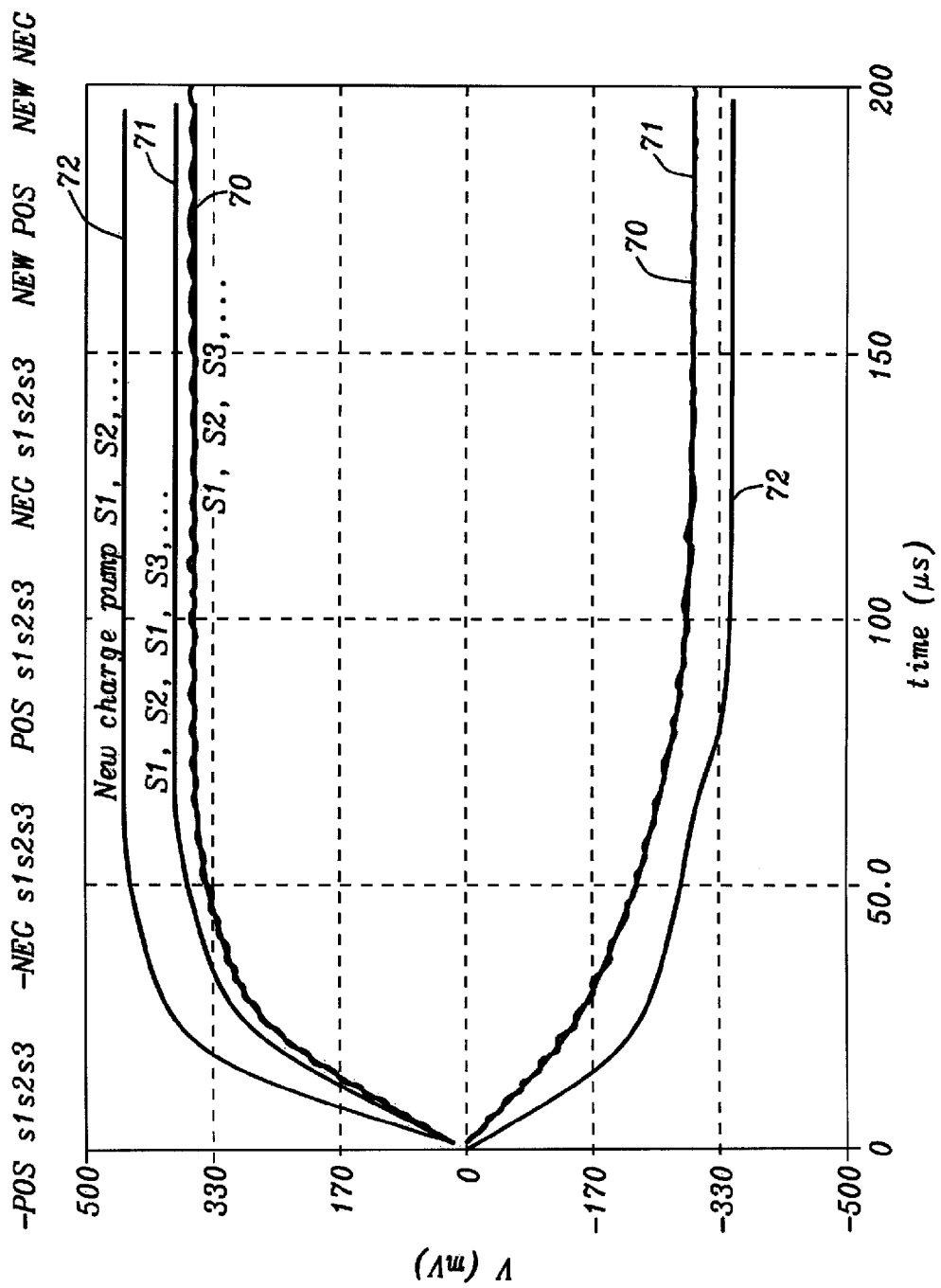
FIG. 7 compares from start-up (i.e. POS=NEG=0) the POS and NEG output voltages with 8 Ohm loads to ground on each of POS and NEG for the charge pump shown in FIG. 5 using state sequences S1, S2, S1, S3 . . . and S1, S2, S3 . . . and the enhanced charge pump shown in FIG. 6.

FIG. 7 compares from start-up (i.e. POS=NEG=0) the POS and NEG output voltages with 8 Ohm loads to ground on each of POS and NEG for the charge pump shown in FIG. 5 using state sequences S1, S2, S1, S3 . . . (curve 71) and S1, S2, S3 . . . (curve 70) and the enhanced charge pump shown in FIG. 6 having two states only (curve 72), VDD=1.5 V (so the ideal unloaded POS=0.5 V, NEG=−0.5 V), a 1 MHz state transition clock is used, the switching network implements 1 Ohm port-port switches and 1 µF flying capacitors are used (these are all non-limiting examples only). 10 µF reservoir capacitors were used to minimize output ripple for highlighting the differences in load regulation.

It should be noted that the 8 Ohm loads are a non-limiting example, other loads could be deployed as well.

It is clear that the new enhanced charge pump exhibits much better POS and NEG load regulation (i.e. less droop from +/−VDD/3=+/−0.5 V when under load) than the charge pump shown in FIG. 5 implementations. The charge pump power conversion efficiency is also improved as expected, as shown in table 1:

TABLE 1

| +/−VDD/3 charge pumps efficiency comparison | |
|---|---|
| Charge pump implementation | Conversion efficiency with 8 Ω loads |
| Pump of FIG. 5 states S1, S2, S3, . . . | 69% |
| Pump of FIG. 5 states S1, S2, S1, S3, . . . | 71% |
| New Enhanced charge pump of FIG. 6 | 80% |

Figure 8:
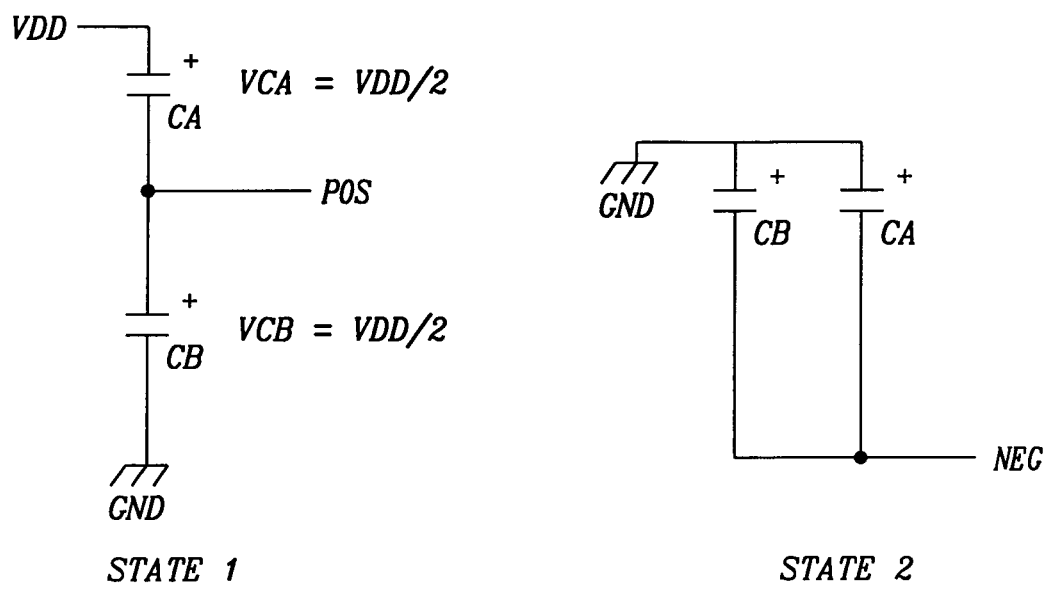
FIG. 8 illustrates a 2-state VDD/2 charge pump with reduced output impedance and maintaining constant capacitor voltages in both states.

The charge pump of FIG. 3 in +/−VDD/2 mode can be improved upon to achieve a 2 state operation with reduced output impedance by using the new switching configurations shown in FIG. 8, which also employs parallel flying capacitor connection.

FIG. 8 illustrates a 2-state VDD/2 charge pump with reduced output impedance and maintaining constant flying capacitor voltages in both states.

Figure 9:
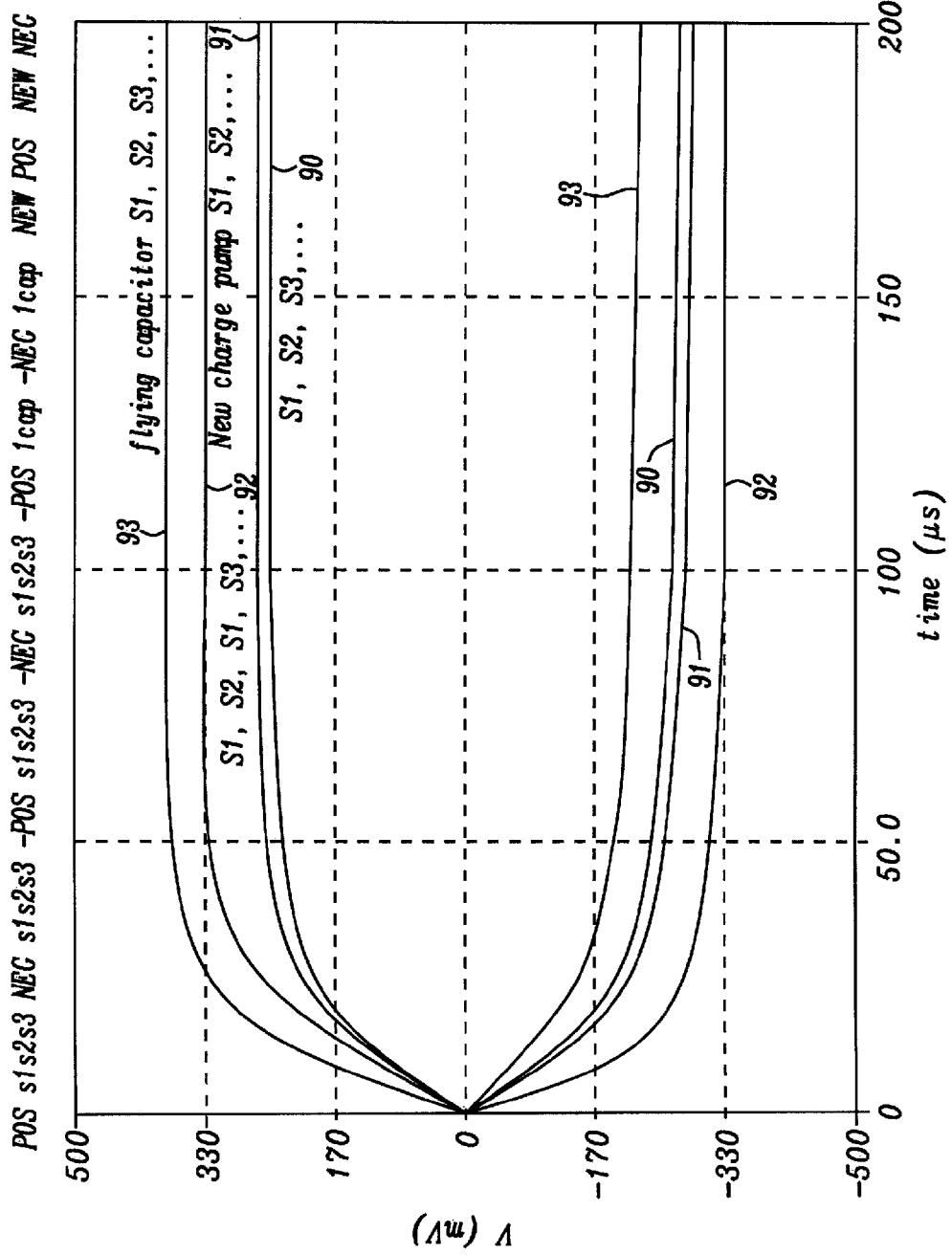
FIG. 9 compares from start-up the POS and NEG output voltages of different +/−VDD/2 charge-pump configurations.

FIG. 9 compares from start-up the POS and NEG output voltages with as a non-limiting example 8 Ohm loads to ground on each of POS and NEG for charge pumps as shown on FIG. 3 using state sequences S1, S2, S1, S3 . . . (curve 91) and S1, S2, S3 . . . (curve 92) and as shown in Error! Reference source not found. (1 flying capacitor and state sequence S1, S2, S3 . . . curve 93) with the new charge pump shown in FIG. 8 (curve 92). The parameters used are for example VDD=1.5 V (so ideal unloaded POS=0.75 V, NEG=−0.75 V), a 1 MHz state transition clock used, the switching network implements 1 Ohm port-port switches and 1 µF flying capacitors are used (these are all non-limiting fairly typical values for class-G audio amplifier charge pump applications).

It is clear that the new charge pump exhibits better POS and NEG load regulation (i.e. less droop from +/−VDD/2=+/−0.75 V when loaded) than the dual flying capacitor implementations shown in FIG. 3. Compared to the implementation shown in FIG. 4 using a single flying capacitor, the POS load regulation is not as good, but the NEG load regulation of the new charge pump shown in FIG. 8 is far superior, and the charge pump symmetry is far superior (almost ideal, POS=−NEG) compared to both charge pumps shown in FIGS. 3 and 4, thus permitting a larger signal swing when used to supply a glass-G amplifier.

The charge pump power conversion efficiency is also improved over the charge pump shown in FIG. 3 and FIG. 4, as shown in Table 2:

TABLE 2

+/−VDD/2 charge pumps efficiency comparison

| Charge pump implementation | Conversion efficiency with 8 Ω loads |
|---|---|
| Charge pump of FIG. 3 states S1, S2, S3, . . . | 51% |
| Charge pump of FIG. 3 states S1, S2, S1, S3, . . . | 53% |
| Charge pump of FIG. 4 single capacitor | 64% |
| New charge pump FIG. 8 | 66% |

Furthermore it should be noted that in some cases the switching network can deploy not only simple switches for connecting its port together. For example more than one switch in series may be required if there are voltage swing limits on the technology of the switches used.

Figure 10:
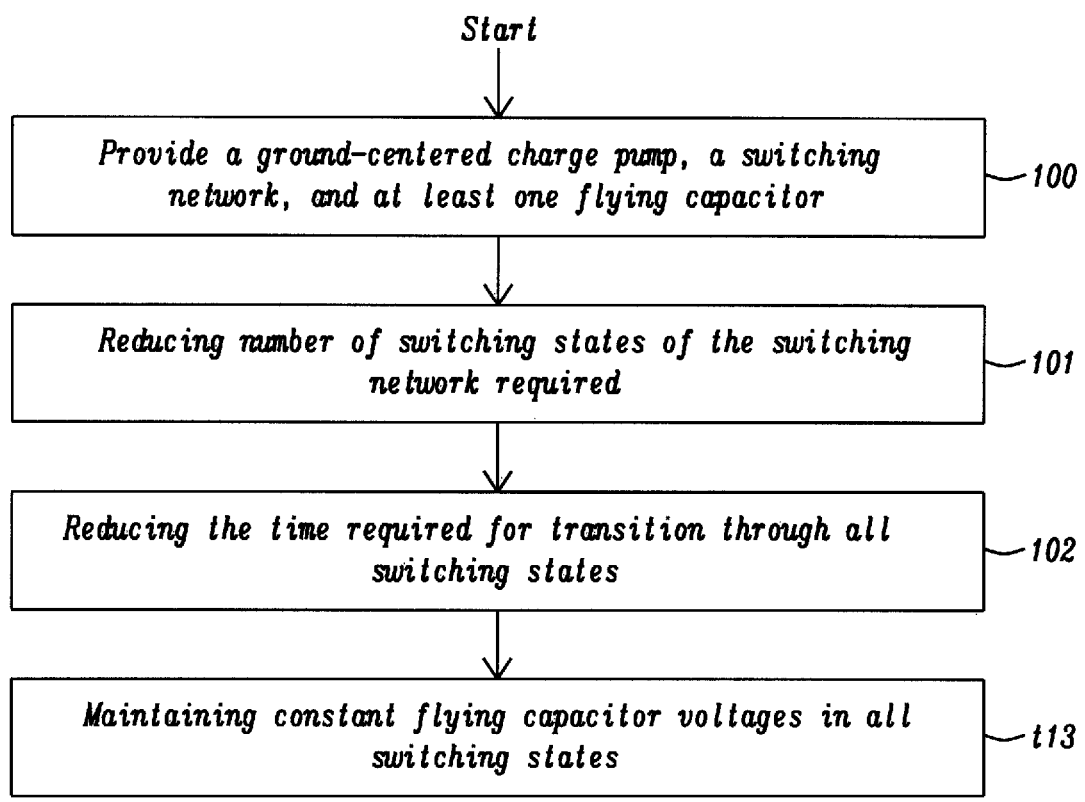
FIG. 10 shows a flowchart of a method achieving high power conversion efficiency of ground-centered charge pumps and minimizing output impedance on both outputs to achieve good load regulation wherein both positive and negative output voltages have an equally divided output voltage compared to an input voltage of the charge pump

FIG. 10 shows a flowchart of a method achieving high power conversion efficiency of ground-centered charge pumps and minimizing output impedance on both outputs to achieve good load regulation wherein both positive and negative output voltages have an equally divided output voltage compared to an input voltage of the charge pump. A first step 100 depicts a provision of a ground-centered charge pump, a switching network, and at least one flying capacitor. The next step 101 shows reducing number of switching states of the switching network required. Step 102 describes reducing the time required for transition through all switching states. The following step 103 illustrates maintaining constant flying capacitor voltages in all switching states.

It should be noted that the method described above are also applicable to other denominators than 2 or 3.

While the invention has been particularly shown and described with reference to the preferred embodiments thereof, it will be understood by those skilled in the art that various changes in form and details may be made without departing from the spirit and scope of the invention.

What is claimed is:

1. A method achieving high power conversion efficiency of ground-centered charge pumps and minimizing output impedance on both outputs to achieve good load regulation, wherein both positive and negative output voltages have an equally divided output voltage compared to an input voltage VDD of the charge pump, wherein the equally divided output voltages comprise +/−VDD/2 and +/−VDD/3 voltages, the method comprising the steps of:
   (1) providing a ground-centered charge pump, a switching network, a port for positive output voltage (VPOS), a port for negative output voltage (VNEG), and at least one flying capacitor;
   (2) reducing number of switching states of the switching network to two states;
   (3) reducing the time required for transition through all switching states; and
   (4) maintaining constant flying capacitor voltages in all switching states.

2. The method of claim 1, wherein the input voltage is divided by 2 by the switching network together with two flying capacitors to achieve the output voltages VPOS=+VDD/2 and VNEG=−VDD/2.

3. The method of claim 2, wherein in a first switching state the switching network switches in a way that VPOS is set to +VDD/2 and the flying capacitor voltage on both flying capacitors is VDD/2.

4. The method of claim 3, where in the first switching state a positive terminal of a first flying capacitor CA of the two flying capacitors is connected to VDD, a negative terminal of CA is connected to the positive output port POS, the positive terminal of a second flying capacitor CB of the two flying capacitors is connected to the positive output port POS, and the negative terminal of CB is connected to ground voltage.

5. The method of claim 2, wherein in a second switching state the switching network switches in a way that VNEG is set to −VDD/2 and the flying capacitor voltage on both flying capacitors remains on VDD/2.

6. The method of claim 5, where in the second switching state both positive terminals of a first flying capacitor CA of the two flying capacitors and of a second flying capacitor CB of the two flying capacitors are connected to ground and both negative terminals of CA and CB are connected to the negative output port NEG.

7. The method of claim 2 wherein a sequence of states can be rearranged to modify output impedances and hence to affect load regulation.

8. The method of claim 1, wherein the input voltage is divided by 3 by the switching network together with two flying capacitors to achieve the output voltages VPOS=+VDD/3 and VNEG=−VDD/3.

9. The method of claim 8, where in a first switching state the switching network switches in a way that VPOS is set to +VDD/3 and the flying capacitor voltage on the first flying capacitor CA of the two flying capacitors is 2×VDD/3 and on the second flying capacitor CB of the two flying capacitors is VDD/3.

10. The method of claim 9, where in the first switching state a positive terminal of the first flying capacitor CA is connected to VDD, a negative terminal of CA is connected to the positive output port POS, the positive terminal of the second flying capacitor CB is connected to the positive output port POS, and the negative terminal of CB is connected to ground voltage.

11. The method of claim 8, wherein in a second switching state the switching network switches in a way that VNEG is set to −VDD/3 and the flying capacitor voltage on a first flying capacitor of the two flying capacitors CA is 2×VDD/3 and on a second flying capacitor CB of the two flying capacitors is VDD/3.

12. The method of claim 11, where in the second switching state the positive terminal of CA is connected to POS and the negative terminal of CA is connected to NEG, the positive terminal of CB is connected to ground and the negative terminal of CB is connected to NEG.

13. The method of claim 8 wherein a sequence of states can be rearranged to modify output impedances and hence to affect load regulation.

14. The method of claim 8 wherein output impedance of the charge pump is reduced by using parallel capacitor connections.

15. A ground-centered charge pump providing voltages of +/−VDD/3 at its respective positive and negative output ports, achieving high power conversion efficiency and minimizing output impedance comprising:
   2 flying capacitors which are connected by a switching network in two switching states in order to generate the voltage of +VDD/3 at a positive output port and the voltage of −VDD/3 at its negative output port; and said switching network configured to operate with two switching states and to maintain constant flying capacitor voltages in both states.

16. The charge pump of claim 15 where in a first switching state the switching network switches in a way that the positive output port is set to +VDD/3 and the voltage on a first flying capacitor CA of the two flying capacitors is 2×VDD/3 and the voltage on the second flying capacitor CB is VDD/3.

17. The charge pump of claim 16, where in the first switching state a positive terminal of the first flying capacitor CA is connected to VDD, a negative terminal of CA is connected to the positive output port POS, the positive terminal of the second flying capacitor CB is connected to the positive output port POS, and the negative terminal of CB is connected to ground voltage.

18. The charge pump of claim 15, wherein in a second switching state the switching network switches in a way that the voltage of the negative output port is set to −VDD/3 and the flying capacitor voltage on the first flying capacitor CA of the two flying capacitors is 2×VDD/3 and on the second flying capacitor CB of the two flying capacitors is VDD/3.

19. The charge pump of claim 18, where in the second switching state the positive terminal of the first flying capacitor CA is connected to the positive output port and the negative terminal of CA is connected to negative output port, the positive terminal of the second flying capacitor CB is connected to ground and the negative terminal of CB is connected to the negative output port.

20. The charge pump of claim 15 wherein a sequence of states can be modified to modify output impedances and hence to affect load regulation.

21. A ground-centered charge pump providing voltages of +/−VDD/2 at its respective positive and negative output ports, achieving high power conversion efficiency and minimizing output impedance comprising:
   2 flying capacitors which are connected by a switching network in two switching states in order to generate the voltage of +VDD/2 at a positive output port and the voltage of −VDD/2 at its negative output port;
   said switching network configured to operate with two switching states and to maintain constant flying capacitor voltages in both states, where in a first switching state a negative terminal of a first capacitor CA of the two capacitors is connected to the positive output port.

22. The charge pump of claim 21, wherein in a first switching state the switching network switches in a way that the positive output port is set to +VDD/2 and a flying capacitor voltage on both flying capacitors is VDD/2.

23. The charge pump of claim 22, where in the first switching state a positive terminal of the first flying capacitor CA is connected to VDD, the positive terminal of the second flying capacitor CB is connected to the positive output port POS, and the negative terminal of CB is connected to ground voltage.

24. The charge-pump of claim 21, where in a second switching state the switching network switches in a way that the negative output port is set to −VDD/2 and the flying capacitor voltage on both flying capacitors remains on VDD/2.

25. The charge-pump of claim 24, where in the second switching state both positive terminals of CA and CB are connected to ground and both negative terminals of CA and CB are connected to the negative output port.

26. The charge-pump of claim 21 wherein a sequence of states can be modified to modify output impedances and hence to affect load regulation.

\* \* \* \* \*